United States Patent [19]

Morimoto

[11] Patent Number: 5,753,933
[45] Date of Patent: May 19, 1998

[54] OPTICAL SEMICONDUCTOR DEVICE

[75] Inventor: Takao Morimoto, Tokyo, Japan

[73] Assignee: NEC Corporation, Tokyo, Japan

[21] Appl. No.: 611,674

[22] Filed: Mar. 6, 1996

[30] Foreign Application Priority Data

Mar. 7, 1995 [JP] Japan ................................. 7-047532

[51] Int. Cl.$^6$ ........................................ H01L 29/06
[52] U.S. Cl. ............................. 257/14; 257/18; 257/22; 372/45; 372/46
[58] Field of Search .............................. 257/14, 18, 22; 372/45, 46

[56] References Cited

U.S. PATENT DOCUMENTS 5,253,264  10/1993  Suzuki et al. ............................ 372/45

OTHER PUBLICATIONS

R. Bhat et al., "OMCVD Grown High Performance 1.3 μm AlGaInAs/InP Strained Quantum Well Lasers," Paper B1-6 (1994).

C. E. Zah et al., "Uncooled Lasers for Deployment of Fiber in the Loop," Optics & Photonics News, Dec. 1993.

Primary Examiner—Minh-Loan Tran
Attorney, Agent, or Firm—Young & Thompson

[57] ABSTRACT

Disclosed is an optical semiconductor device includes a multiquantum well structure comprising a well layer and a barrier layer, wherein: the well layer is made of InGaAsP, InGaAs or InGaP; the barrier layer is made of InGaAlAsP, InGaAlAs or InGaAlP; and optionally the well layer has the same In/Ga ratio as the barrier layer and the well layer is compressively strained. Also disclosed is a vapor-phase growth method of a multiquantum well structure comprises a well layer and a barrier layer or further comprises an intermediate layer between the well layer and the barrier layer, comprising the steps of: continuously supplying at a constant flow rate one or several V group gases and one or several first III group gases during the growth of the multiquantum well; forming the well and barrier layer by interrupting the supply of a second III group gas different from the first III group gas; and forming the intermediate layer by varying a flow rate of the second III group gas.

14 Claims, 7 Drawing Sheets

FIG. 7
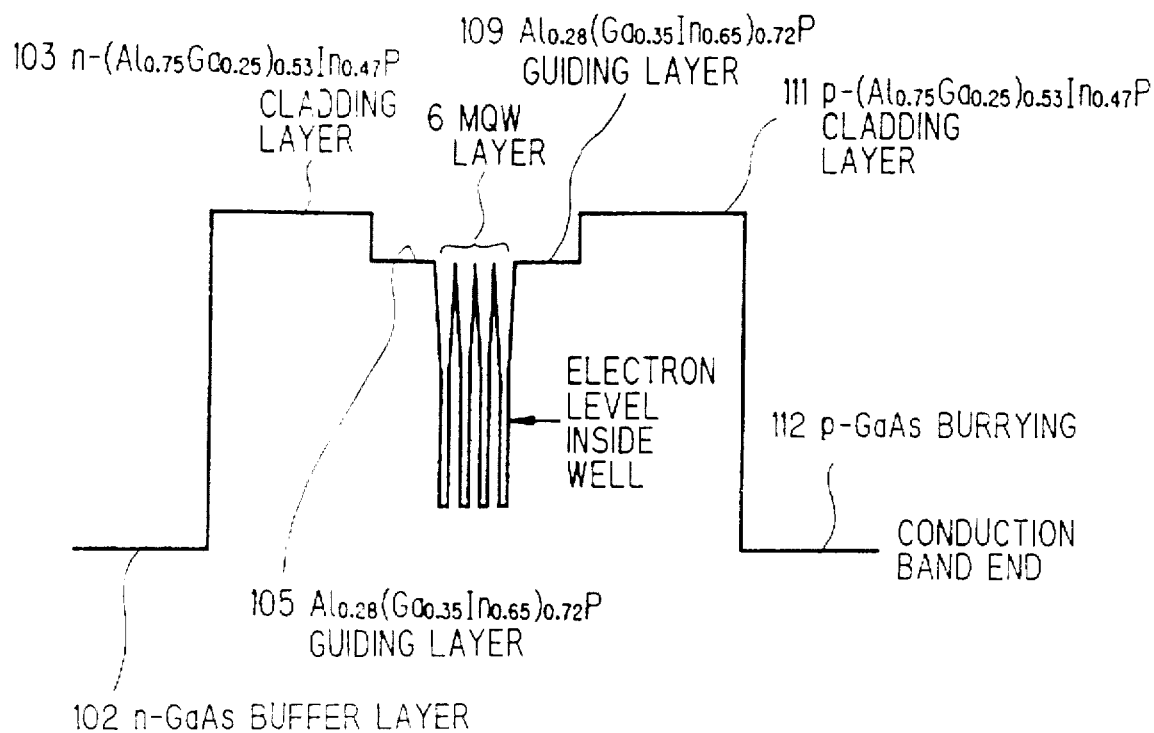
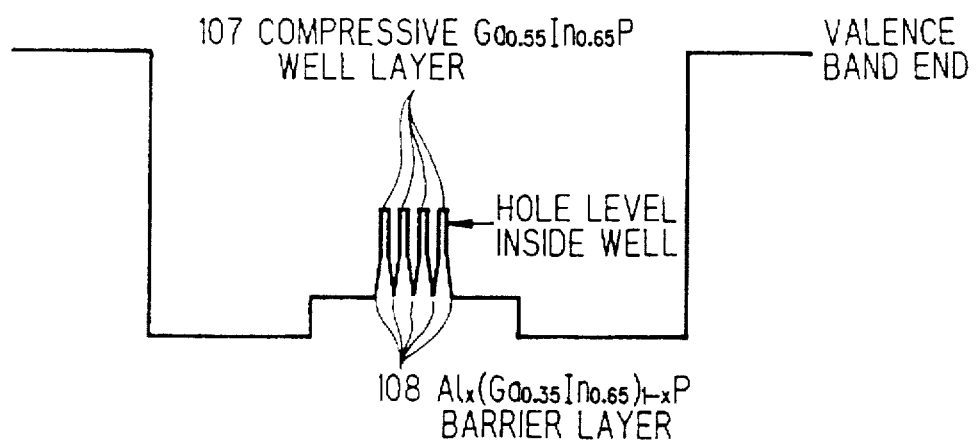

OPTICAL SEMICONDUCTOR DEVICE

FIELD OF THE INVENTION

This invention relates to an optical semiconductor device, and more particularly to, an optical semiconductor device which has a multiquantum well(MQW) structure with mixed crystals composed of In, Ga, Al, As and P and a method for making the same.

BACKGROUND OF THE INVENTION

The temperature characteristics of a conventional long wavelength(1.3–1.55 µm) quantum well laser have recently been improved by employing InGaAlAs materials system instead of InGaAsP materials system. The reason why the InGaAlAs materials system improves the high-temperature characteristics is that electron with the smaller effective mass can be effectively confined in the well layer due to the large conduction band offset. For example, such improvement is disclosed in R. Bhat et al., "OMCVD Grown High Performance 1.3 µm AlGaInAs/InP Strained Quantum Well Lasers", 7th International Conference on Metalorganic vapor Phase Epitaxy, paper B1-6(1994), and C. E. Zah et al., "Uncooled Lasers for Deployment of Fiber in the Loop", Optics & Photonics News/ December(1993).

However, in the conventional MQW structure, since the well contains Al, defects may occur by the mixing of very small amount of oxygen in the crystal growth. Therefore, it may cause the degradation of a device during a long-time operation. Namely, is difficult for a device with high reliability to be produced.

Furthermore, with regard to the formation of a well/barrier interface, there is a problem that a pressure variation may occur by switching a valve when an organic metal gas from a bubbler is supplied to the injection-line or the vent-line. When the supplying of growth gas is switched from the injection-line to the vent-line, the pressure on the injection-line are fluctuated. By connecting the gas supplying line thereto, the upstream bubbler is also affected by the pressure fluctuation. In particular, in the case of an organic metal with large vapor pressure such as TMAl which needs a low flow rate of $H_2$, the variation of flow rate caused by the pressure fluctuation is significant. Therefore, TMAl drawing from the bubbler etc. may occur and Al may thereby be segregated. The transformed layer where Al is segregated on the interface has poor crystallization performance and reduced reliability with causing the increased threshold current and reduced optical output.

On the other hand, when Al is contained in the well, InGaAlAs or InAlAs layer with high composition ratio of Al will be employed as the barrier, guiding and cladding layer. However, when InGaAlAs or InAlAs layer with high composition ratio of Al is grown, the growth temperature have to be varied during the growth since the optimum growth condition thereof is different from that of InP. Therefore, such optical semiconductor device that contains Al with high composition ratio is not suitable for the stable production.

Furthermore, in the case of compressive strained InGaAsP materials system well, the heavy hole level and light hole level can be sufficiently separated and the affection of the light hole can be neglected due to the hole-side deep well, thereby obtaining a large optical gain due to the connection of the heavy hole and electron. However, when the well is composed of InGaAlAs materials system, the heavy hole level and light hole level can not be sufficiently separated and the affection of the light hole can not be neglected due to the hole-side shallow well. Therefore, the optical gain of the heavy hole can not be sufficiently increased.

SUMMARY OF THE INVENTION

Accordingly, it is an object of the invention to provide an optical semiconductor device and a method for making the same in which the introduction of crystal defect can be avoided to reduce the threshold current and improve the optical output as well as the reliability.

According to the invention, an optical semiconductor device includes a multiquantum well structure comprising a well layer and a barrier layer, wherein:

the well layer is made of InGaAsP; and the barrier layer is made of InGaAlAsP.

According to the second aspect of the invention, an optical semiconductor device includes a multiquantum well structure comprising a well layer and a barrier layer, wherein:

the well layer is made of InGaAs;

the barrier layer is made of InGaAlAs;

the well layer has the same In/Ga ratio as the barrier layer; and the well layer is compressively strained.

According to the third aspect of the invention, an optical semiconductor device includes a multiquantum well structure comprising a well layer and a barrier layer, wherein:

the well layer is made of InGaP;

the barrier layer is made of InGaAlP;

the well layer has the same In/Ga ratio as the barrier layer; and the well layer is compressively strained.

According to the fourth aspect of the invention, an optical semiconductor device includes a multiquantum well structure comprising a compressive strained InAsP well layer and a InGaAsP barrier layer, wherein:

the well layer has the same As/P ratio as the barrier layer; the well and barrier layers and an intermediate layer have a constant As/P ratio when the InGaAsP intermediate layer is provided between the well and barrier layers; and the intermediate layer has a Ga ratio in III group element contained therein which is less than that of the barrier layer.

According to the fifth aspect of the invention, a vapor-phase growth method of a multiquantum well structure comprises a well layer and a barrier layer or further comprises an intermediate layer between the well layer and the barrier layer, comprising the steps of:

continuously supplying at a constant flow rate one or several V group gases and one or several first III group gases during the growth of the multiquantum well;

forming the well and barrier layer by interrupting the supply of a second III group gas different from the first III group gas; and forming the intermediate layer by varying a flow rate of the second III group gas.

In accordance with the invention, in the crystal growth of MQW structure, well/barrier layers can be structured only by ON or OFF of TMAl supplying, thereby preventing the fluctuation of the supplying flow rate such as an overshoot since the variation of pressure caused by the valve switching does not exist. As a result, the transformed layer which has a degraded composition by Al segregation etc. is not generated. Therefore, the introduction of crystal defect can be avoided to reduce the threshold current and improve the optical output as well as the reliability.

On the other hand, by employing InGaAsP well/ InGaAlAsP barrier, the hole-side well depth $\Delta Ev$ is not so short as compared with the conventional InGaAlAs well/InGaAlAs barrier materials system. Therefore, the light hole level and heavy hole level can be sufficiently separated to improve the optical gain. Furthermore, the light hole level can be expelled. As a result, the threshold current can be reduced and the temperature characteristics can be improved.

In addition to the Al-free well layer, Al in barrier, guiding, SCH and cladding layers can be decreased to the minimum necessary amount by employing P(phosphor) with short atomic radius to InAlGaAs crystal system to match a lattice constant. The defect caused by the linkage of Al and oxygen can be suppressed. Due to the small amount of Al, the optimum growth temperature thereof is near to that of InP. Therefore, a series of growth can be continuously performed in a constant temperature to facilitate the stable production.

Furthermore, according to the present vapor-phase growth method, crystal with no inter-diffusion of As and P and no carrying-in of $AsH_3$ can be obtained since the switching of flow rates of $AsH_3$ and $PH_3$ is not needed between the well and barrier layers.

Moreover, MTF(median time to failure) of the semiconductor laser produced by the present vapor-phase growth method can be improved to more than a million hours whereas it is difficult for the semiconductor laser produced by the conventional method to always keep MTF more than a hundred thousand hours.

BRIEF DESCRIPTION OF THE DRAWINGS

The invention will be explained in more detail in conjunction with the appended drawings, wherein:

FIG. 7 shows a band lineup diagram in the main portion of the optical semiconductor device in the second preferred embodiment.

DESCRIPTION OF THE PREFERRED EMBODIMENTS

Before explaining an optical semiconductor device and method for making the same in the preferred embodiment, the aforementioned conventional optical semiconductor device and method for making the same will be explained in FIGS. 1 to 3.

Figure 1:
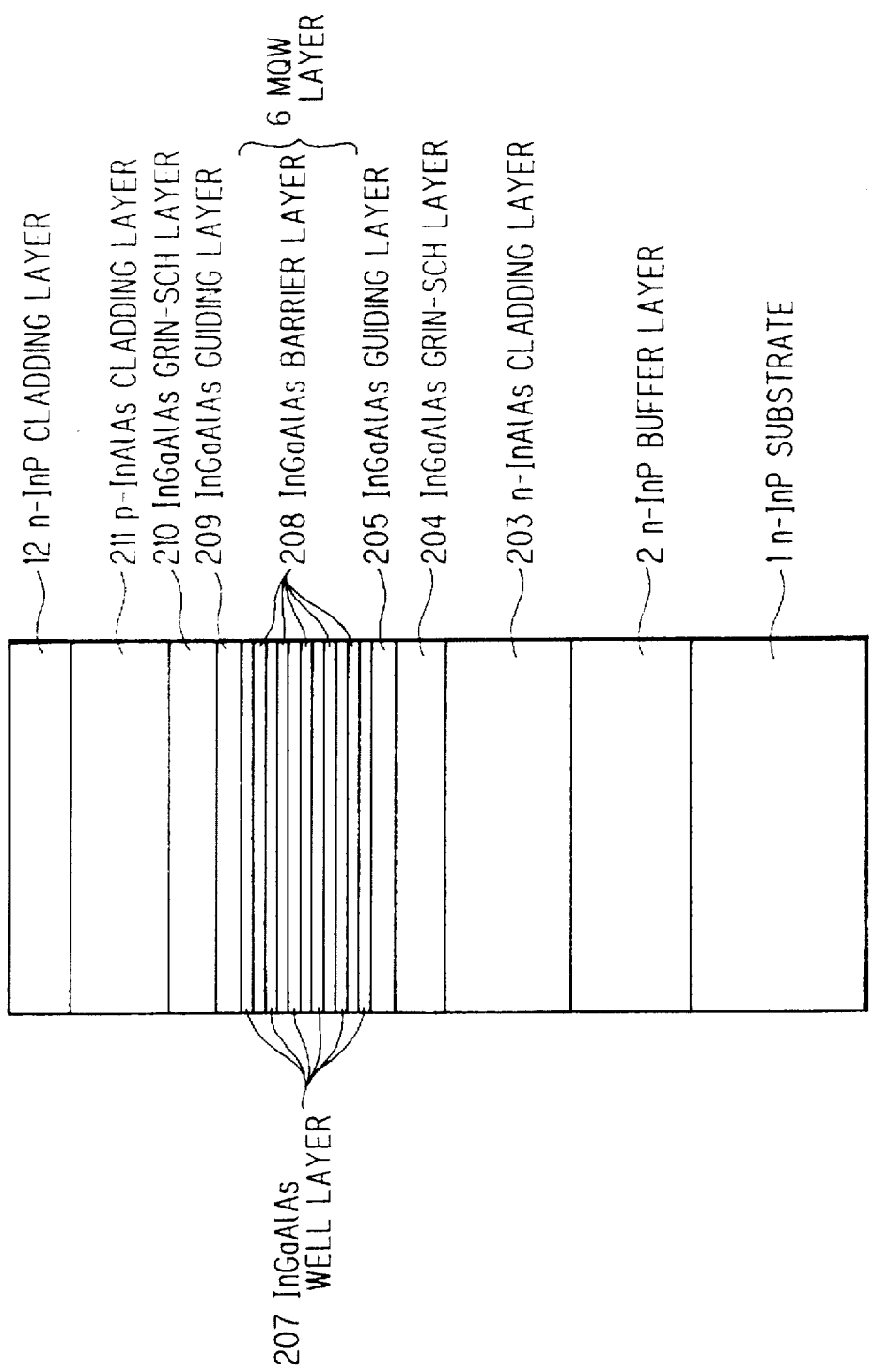
FIG. 1 is a cross sectional view showing a conventional semiconductor laser.

The multiquantum well(MQW) structure in the conventional semiconductor laser is as shown in FIG. 1, which is a cross sectional view thereof. FIG. 2 is a diagram showing the band lineup of the MQW structure in FIG. 1. FIG. 3 is a cross sectional view showing the semiconductor laser employing the MQW structure.

With Reference to FIG. 1, the metalorganic vapor phase epitaxy(MOVPE) method is proceeded as below. First, used for MOVPE are raw material gases of trimethylindium (TMI), trimethylgallium(TMG), trimethylaluminum (TMAl), arsine($AsH_3$) and phosphine($PH_3$). organic metals are supplied through hydrogen bubbling.

Continuously grown on a face direction(100) n-InP substrate 1 are a 0.4 μm n-InP buffer layer 2, a 1 μm n-InAlAs cladding layer 203, a 100 nm n-InAlGaAs GRIN-SCH (graded index separate confinement hetero-structure) layer 204, a 15 nm n-InGaAlAs guiding layer 205, a MQW layer 6, subsequently in the contrary order to n-side, a 15 nm p-InGaAlAs guiding layer 209, a 100 nm p-InGaAlAs GRIN-SCH layer 210, a 0.3 μm p-InAlAs cladding layer 211, and a 100 nm p-InP cladding layer 12. The GRIN-SCH layer has a composition that varies from 0.96 μm bandgap wavelength $In_{0.525}Ga_{0.095}Al_{0.38}As$ to 1.1 μm bandgap wavelength $In_{0.527}Ga_{0.2}Al_{0.273}As$.

The MQW layer 6 comprises five 5 nm InGaAlAs well layers 207, between which 8 nm InGaAlAs barrier layers 208 are sandwiched. The InGaAlAs well layer 207 has a composition of 1.2% compressive strained $In_{0.7}Ga_{0.12}Al_{0.18}As$. The InGaAlAs barrier layer 208 is strainless and has a bandgap wavelength of 1.1 μm $In_{0.527}Ga_{0.2}Al_{0.273}As$. To make the interface between the InGaAlAs well layer 207 and the InGaAlAs barrier layer 208, the MOVPE apparatus is provided with two piping systems for well and barrier to supply TMI, TMG and TMAl. The shifting from well to barrier as to organic III group is as follows. When the growth of well is finished, the supply from a gas line for well to a reactor tube is changed to a line that flows into an exhaust not through the reactor tube (hereinafter referred to as "vent-line"), thereafter waiting for 5 sec., then changing the supply from a gas line for barrier that is connected with the vent-line into a supply line to the reactor tube(hereinafter referred to as "injection-line"). The shifting from barrier to well is carried out to the contrary.

Figure 2:
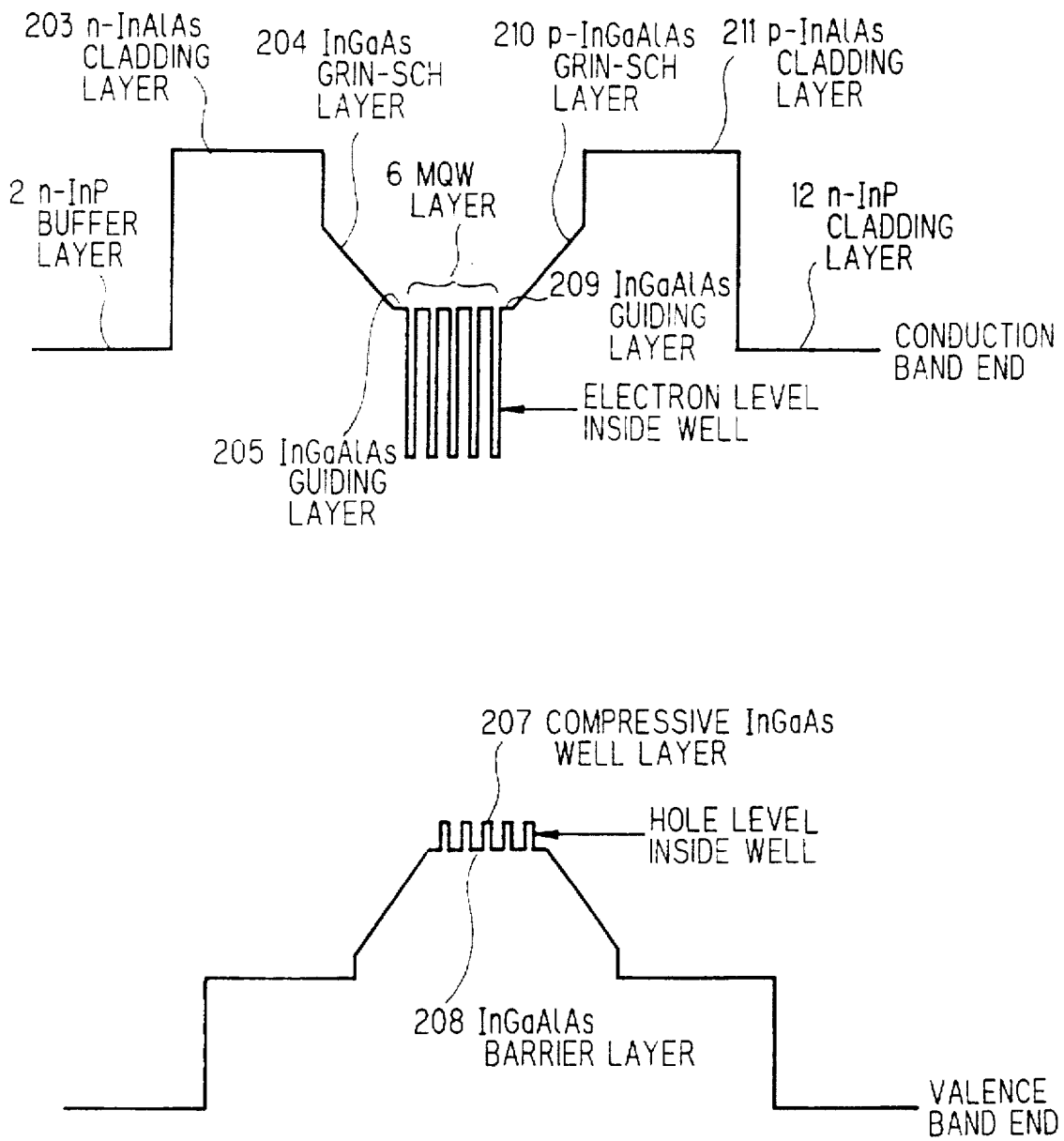
FIG. 2 band lineup diagram in the conventional semiconductor laser in FIG. 1.

FIG. 2 shows the band lineup of the above structure. As compared with MQW of InGaAsP system, the merit of the band lineup of InGaAlAs system is that conduction band offset ΔEc larger than valence band offset ΔEv can be obtained. More important is that the energy difference δEc between electron level inside well and barrier band end is lager than the energy difference δEv between hole level inside well and barrier band end. To suppress the carrier overflowing caused by smaller effective mass of electron, in other words, overflowing of electron from a potential well, to increase the gain, δEc is required to be more than 100 meV. To suppress the non-uniform injection into each well caused by larger effective mass of hole, δEv is required to be less than. 100 mev. These requirements are satisfied by InGaAlAs system whereas they are not satisfied by InGaAsP system.

Figure 3:
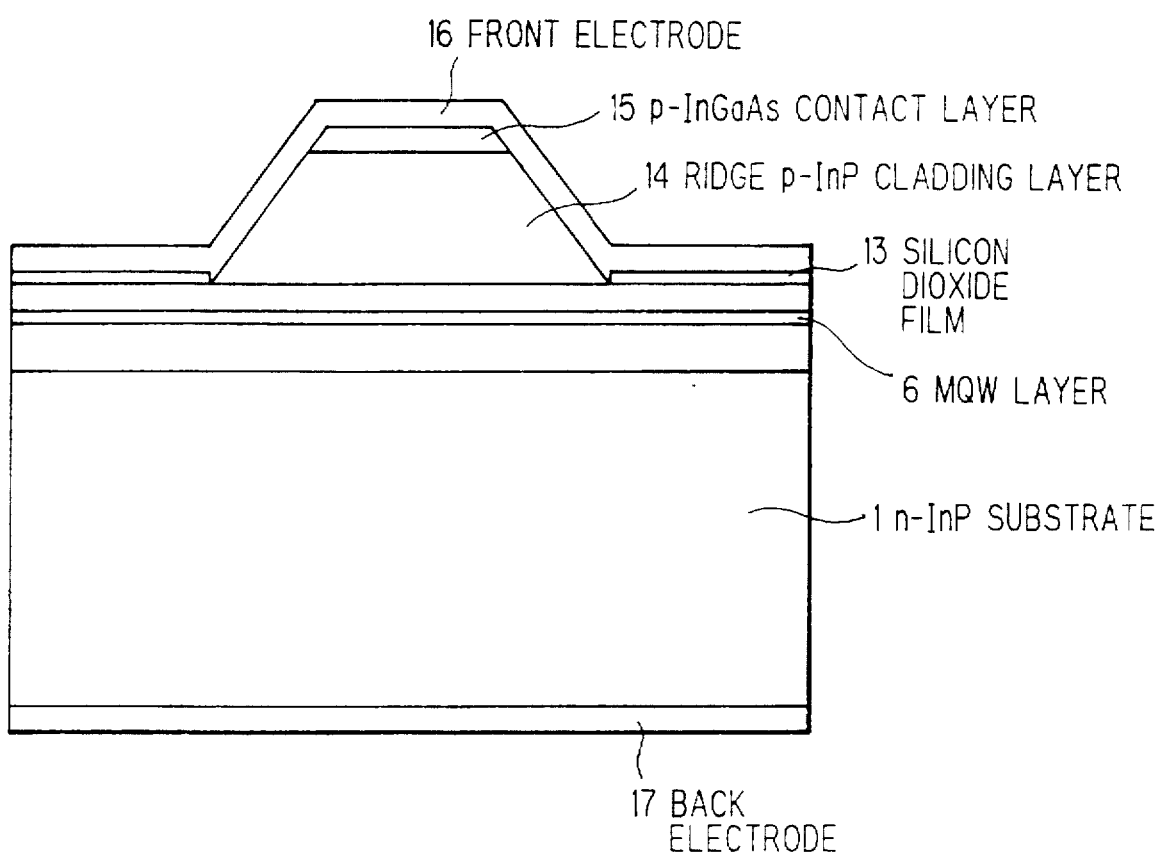
FIG. 3 a cross sectional view showing a conventional semiconductor laser.

Next, using the grown wafer in FIG. 1 as a substrate, a ridge portion is selectively grown thereon as shown in FIG. 3. First, stripe silicon dioxide film 13 is formed and then a ridge p-InP cladding layer 14 is grown. Then a p-InGaAs contact layer 15 is grown. Finally, a front electrode 16 is formed by the vapor deposition or sputtering method, polishing the back surface to give the wafer thickness of 100 μm, then forming a back electrode 17 thereon.

This wafer is cleaved 300 μm in resonator length, then providing 30% reflectivity front end coating film and 75% reflectivity back end coating film, thereby obtaining a conventional semiconductor laser.

Figure 4:
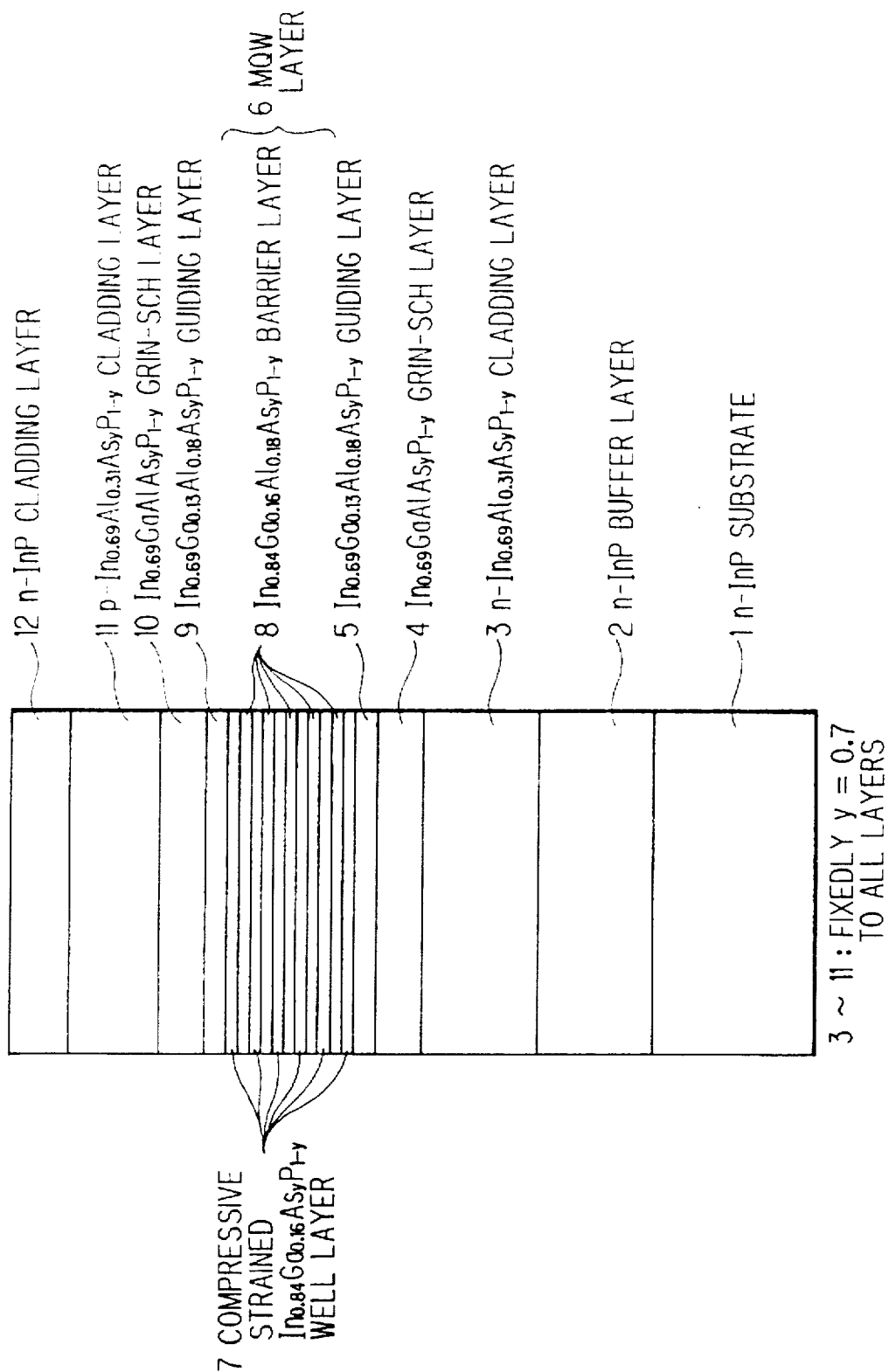
FIG. 4 is a cross sectional view showing an optical semiconductor device in a first preferred embodiment according to the invention.
Figure 5:
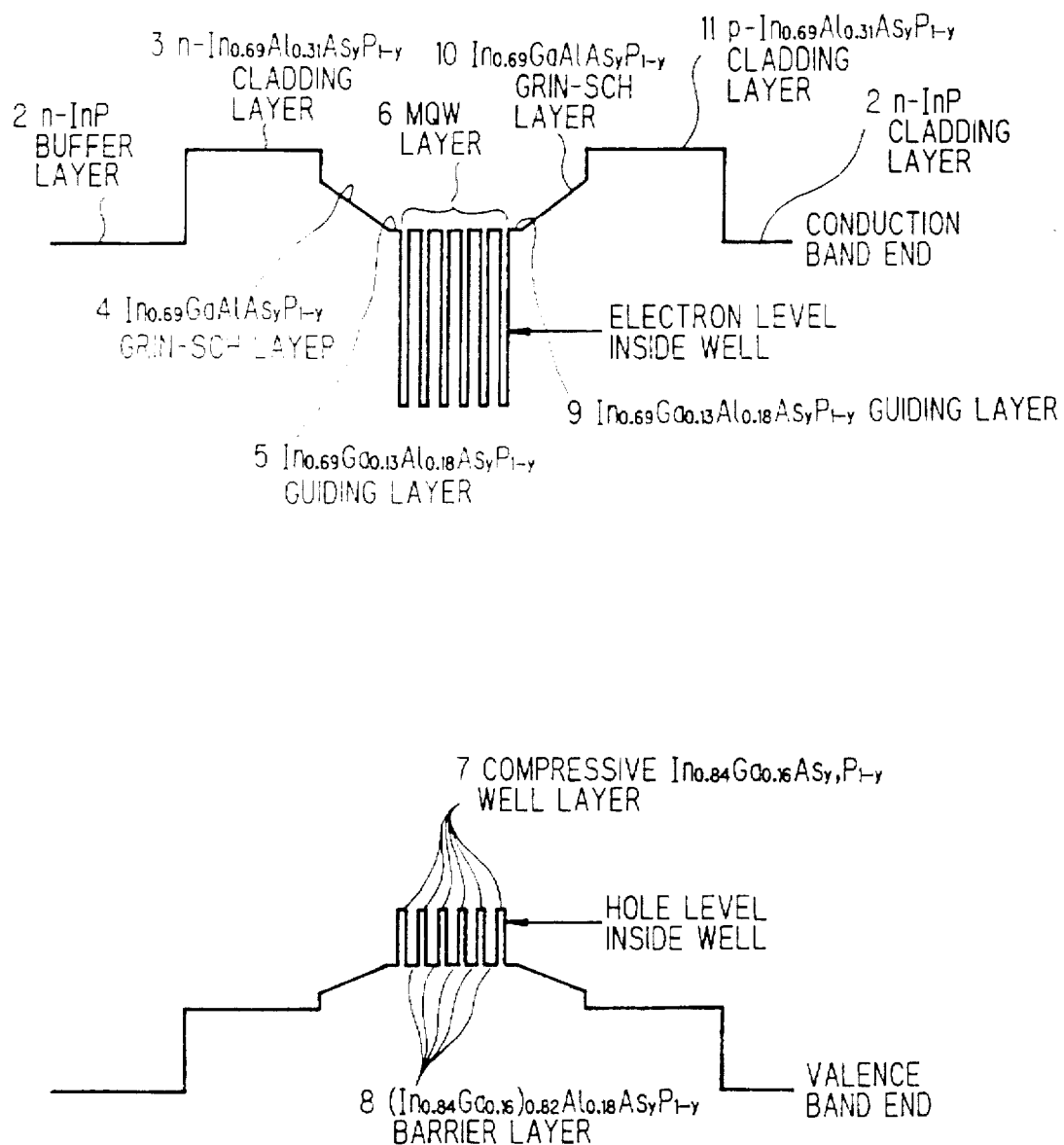
FIG. 5 shows a band lineup diagram in the main portion of the optical semiconductor device in the first preferred embodiment.

Next, an optical semiconductor device in the first preferred embodiment will be explained in FIG. 4, wherein like parts are indicated by like reference numerals as used in FIG. 1. FIG. 4 is a cross sectional view showing of the optical semiconductor device with a multiquantum well (MQW) structure in the first embodiment. FIG. 5 is a diagram showing the band lineup of the MQW structure in FIG. 4. FIG. 3 is also a cross sectional view showing a semiconductor laser with the MQW structure according to the invention.

As shown in FIG. 4, the lowest layers are a face direction (100) n-InP substrate 1 and n-InP buffer layer 2 which have a thickness of 0.4 μm. Provided thereon are mixed crystals of a n-$In_{0.69}Al_{0.31}As_yP_{1-y}$ cladding layer 3 to a p-$In_{0.69}Al_{0.31}As_yP_{1-y}$ cladding layer 11 which are always constantly y=0.65. In the mixed crystal layers, positioned in the order from the lower layer are the 0.2 μm n-$In_{0.69}Al_{0.31}As_yP_{1-y}$ cladding layer 3 with 0.9 μm bandgap wavelength which has lattice matching with InP, a 50 nm n-$In_{0.69}GaAlAs_yP_{1-y}$ GRIN-SCH layer 4 in which the composition of Ga and Al varies from n-$In_{0.69}Ga_{0.05}Al_{0.26}As_yP_{1-y}$ with 0.96 μm bandgap wavelength to n-$In_{0.69}Ga_{0.13}Al_{0.18}As_yP_{1-y}$ with 1.05 μm bandgap wavelength, a 15 nm n-$In_{0.69}Ga_{0.13}Al_{0.18}As_yP_{1-y}$ guiding layer 5 which has the same composition as the last n-$In_{0.69}GaAlAs_yP_{1-y}$ GRIN-SCH layer 4.

Subsequently, provided thereon is a MQW layer 6 which comprises six 4 nm 1% compressive strained $In_{0.84}Ga_{0.16}As_yP_{1-y}$ well layers 7 which have strainless 8 nm $(In_{0.84}Ga_{0.16})_{0.82}Al_{0.18}As_yP_{1-y}$ barrier layers 8 with 1.05 μm bandgap wavelength therebetween. The composition of the MQW layer 6 is determined to satisfy requirements as below. First, to improve the reliability, the well layer does not contain Al. Second, separating the level of heavy hole from the level of light hole, 1% compressive strain is applied such that only the heavy hole efficiently contributes to the luminescence. If the applied strain is more than 1.5%, then crystal defect occurs by excessive stress. Therefore, the strain is suitably about 1%. Third, the thickness of the well is narrowed to 4 nm to sufficiently give quantum effects such as separating the level of light hole. If it is too narrow, it will be affected by the roughness on the interface of well/barrier. Therefore, the well thickness is suitably about 4 nm. Satisfying the first to third requirements, the oscillation wavelength is adjusted to 1.3 μm, thereby obtaining the above-mentioned well composition of $In_{0.84}Ga_{0.16}GA_{0.65}P_{0.35}$. In the barrier layer, adding Al to this well composition while maintaining equal Ga/In and As/P ratios, the strainless composition is given. As a result, the barrier composition is $(In_{0.84}Ga_{0.16})_{0.82}Al_{0.16}A_{0.65}P_{0.35}$.

Next, the n-$In_{0.69}Ga_{0.13}Al_{0.18}As_yP_{1-y}$ guiding layer 9 with which the n-$In_{0.69}Ga_{0.13}Al_{0.18}As_yP_{1-y}$ guiding layer 5 sandwiches the MQW layer 6 have the same composition as the barrier composition. The thickness of each layer is 15 nm such that the exudation of wave function of the carrier inside well does not affect the external GRIN-SCH layer. Provided thereon is a 50 nm p-$In_{0.68}GaAlAs_yP_{1-y}$ GRIN-SCH layer 10 has a composition that continuously varies the same composition as the n-$In_{0.69}Ga_{0.13}Al_{0.18}As_yP_{1-y}$ guiding layer 9 to 0.96 μm bandgap wavelength composition as in the n-$In_{0.69}GaAlAs_yP_{1-y}$ GRIN-SCH layer 4. Provided thereon are a 0.2 μm p-$In_{0.69}Al_{0.31}As_yP_{1-y}$ cladding layer 11 and a 100 nm p-InP cladding layer 12.

The band structure in such combination of well/barrier is shown in FIG. 5. The energy difference δEc between the electron level inside the well and the barrier band end is a value between 100 meV and 200 mev, and the energy difference δEv between the heavy hole level of the well and the barrier band end is a value between 30 mev and 100 meV. Thereby, a large optical gain, a small internal loss, a high quantum efficiency and very good temperature characteristics are obtained. The relation of the high δEc and low δEv is desirable because the overflowing of carrier caused by the smaller effective mass of electron can be suppressed and the non-uniform injection to the MQW layer 6 caused by the larger effective mass of hole can be prevented. In the band lineup in the first embodiment, since the hole-side quantum well is sufficiently shallow, the light hole level and the heavy hole level is sufficiently separated when the strain is more than 1% and the thickness of the well layer is less than 4 nm. Therefore, when the barrier composition is adjusted to reduce the bandgap to some degree, the light hole level is expelled from the well to obtain a large optical gain.

The above compositions of the respective layers are related to the crystal growth method by MOVPE, which will be explained below. First, TMI and $PH_3$ are supplied on the face direction (100) n-InP substrate 1 to grow the n-InP buffer layer 2. Next, TMI, TMAl, $AsH_3$ and $PH_3$ are supplied to grow the n-$In_{0.69}Al_{0.31}As_yP_{1-y}$ cladding layer 3. Thereafter, until the formation of the n-$In_{0.69}Al_{0.31}As_yP_{1-y}$ cladding layer 11, TMI, $AsH_3$, and $PH_3$ is constantly supplied while varying only the supplying amount of TMAl and TMG. The n-$In_{0.69}GaAlAs_yP_{1-y}$ GRIN-SCH layer 4 is formed such that the supplying amount of TMG is continuously increased and the supplying amount of TMAl is continuously decreased while keeping the supplying amount of TMI. Maintaining their last supplying amounts, the n-$In_{0.69}Ga_{0.13}Al_{0.18}As_yP_{1-y}$ guiding layer 5 is grown. Thereafter, when shifting to the compressive strained $In_{0.84}Ga_{0.16}As_yP_{1-y}$ well layers 7, TMI, TMG and $AsH_3$ are constantly flown and only the supplying of TMAl is stopped. On the contrary, when shifting from the well layer to the barrier layer, TMI, TMG and $AsH_3$ are constantly flown and the supplying of TMAl is started. The p-$In_{0.69}Ga_{0.13}Al_{0.18}As_yP_{1-y}$ guiding layer 9, p-$In_{0.69}GaAlAs_yP_{1-y}$ GRIN-SCH layer 10 and p-$In_{0.69}Al_{0.31}As_yP_{1-y}$ cladding layer 11 are similarly formed in the contrary order of the n-side layers. $Si_2H_6$ and DMZn gases are suitably doped. In the above growth process, the optimum growth temperature is close to that of n-InP since the Al amount contained in the respective layers is small. Therefore, the growth is carried out in a constant temperature.

After the epitaxial layers as in FIG. 4 are such grown by the MOVPE method, the ridge portion will be grown as shown in FIG. 3. First, stripe silicon dioxide film 13 is formed and then a ridge p-InP cladding layer 14 is grown. Then a p-InGaAs contact layer 15 is grown. Finally, a front electrode 16 is formed by the vapor deposition or sputtering method, polishing the back surface to give the wafer thickness of 100 μm, then forming a back electrode 17 thereon.

This wafer is cleaved 300 μm in resonator length, then providing 30% reflectivity front end coating film and 75% reflectivity back end coating film. Alternatively, the wafer is cleaved 150 μm in resonator length, then providing 80% reflectivity front end coating film and 95% reflectivity back end coating film. Thereby, the variation of optical output can be suppressed less than 2 dB in temperature of −40° C. to 85° C.

The above structure can also be applied to an integrated optical device etc. Although the above embodiment is referred to the ridge structure on n-InP substrate, it can be further applied to the other lateral mode control structure.

Figure 6:
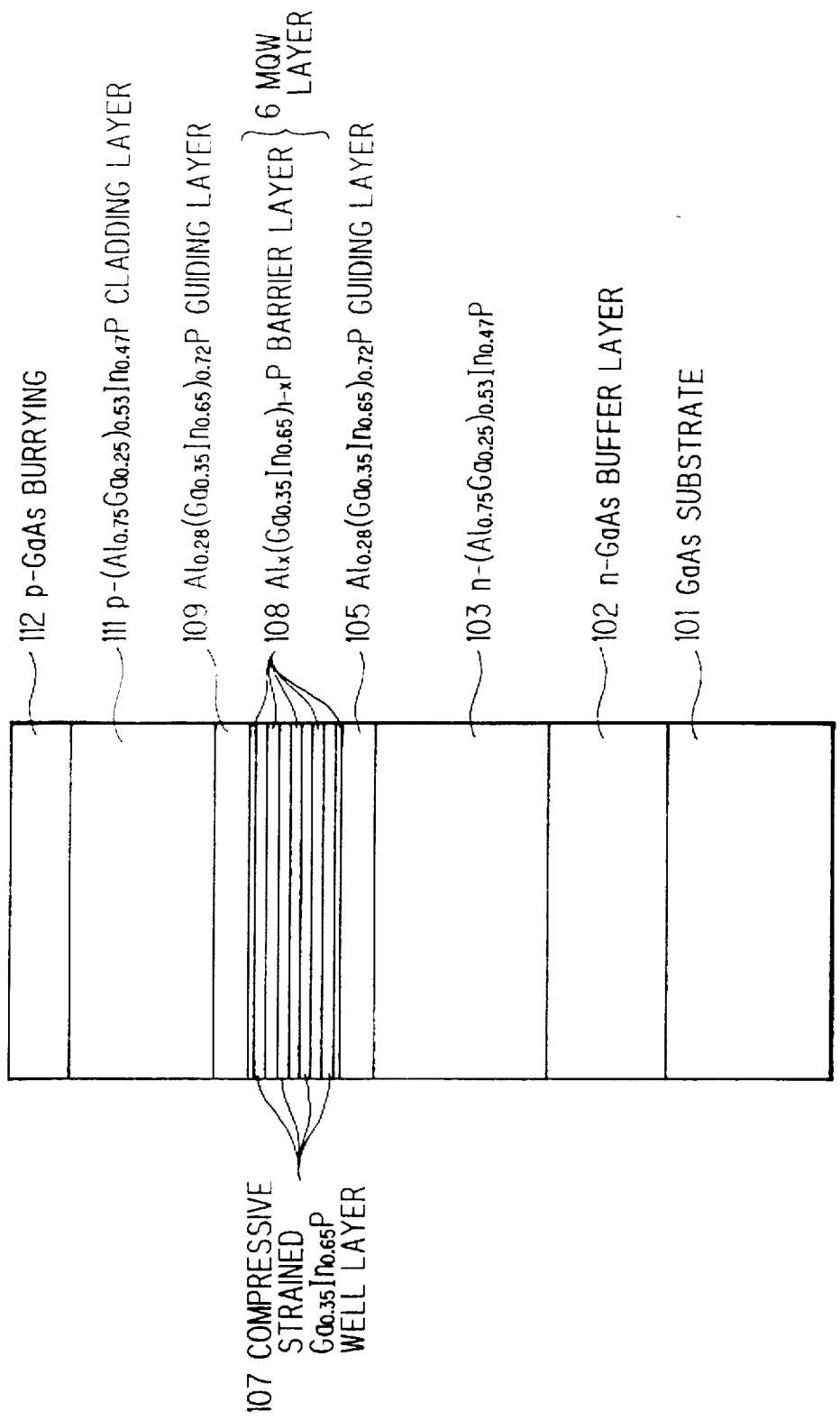
FIG. 6 is a cross sectional view showing a an optical semiconductor device in a second preferred embodiment according to the invention.

An optical semiconductor device in the second preferred embodiment will be explained in FIG. 6, which is a cross sectional view showing the multiquantum well(MQW) structure of the optical semiconductor device in the second embodiment. FIG. 7 is a diagram showing the band lineup of the MQW structure in FIG. 6.

First, a 0.4 μm n-GaAs buffer layer 102 and a 1 μm n-$(Al_{0.75}Ga_{0.25})_{0.53}In_{0.47}P$ cladding layer 103 are grown on a n-GaAs substrate 101. Next, $Al_{0.28}(Ga_{0.35}In_{0.65})_{0.72}P$ guiding layer 105, a MQW layer 6 and $Al_{0.28}(Ga_{0.35}In_{0.65})_{0.72}P$ guiding layer 109 are grown, while keeping the supplying amount of TMG, TMI and $PH_3$ constant and varying only the supplying amount of TMAl. The MQW layer 6 comprises four 1.2% compressive strained $Ga_{0.35}In_{0.65}P$ well layers 107 and $Al_x(Ga_{0.35}In_{0.65})_{1-x}P$ barrier layers 108 which have the composition that gradually varies from $x=0.14$ at the point in contact with the well to $x=0.28$. The $Al_x(Ga_{0.35}In_{0.65})_{1-x}P$ barrier layers 108 with $x=0.28$ has the same composition as the $Al_{0.28}(Ga_{0.35}In_{0.65})_{0.72}P$ guiding layer and is strainless.

When the strain of 1.2% or more is applied as in the second embodiment, dislocation may occur by a stress. However, the dislocation caused by the shear stress in the extreme change of lattice constant can be prevented by contacting a 1.2% strained portion with a 0.6% medium strained portion and continuously varying to strainless therefrom. Namely, when only the supplying amount of TMAl is varied as in the second embodiment, the strain can be adjusted to be continuously varied. Thereby, a graded barrier with high reproducibility can be easily produced.

Although the well layer comprises InGaAsP or GaInP in the first and second embodiments, a well layer of compressive strained InAsP and a barrier layer of InGaAsP may be employed while equalizing the As/P ratio in the well and barrier layers.

Furthermore, a InGaAsP intermediate layer between the well and barrier layers may be provided while equalizing the As/P ratio among the well, barrier and intermediate layers and designing such that Ga ratio in III group elements contained in the InGaAsP intermediate layer is less than that included in the barrier layer.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. An optical semiconductor device which includes a multiquantum well structure comprising a well layer and a barrier layer, wherein:

said well layer is made of InGaAsP; and said barrier layer is made of InGaAlAsP.

2. An optical semiconductor device, according to claim 1, wherein:

said well layer has the same As/P ratio as said barrier layer.

3. An optical semiconductor device, according to claim 2, wherein:

said well layer has the same In/Ga ratio as said barrier layer; and said well layer is compressively strained.

4. An optical semiconductor device, according to claim 2, further comprising guiding layers sandwiching said multiquantum well structure and cladding layers sandwiching said guiding layers, wherein:

said well, barrier and guiding layers or said well, barrier, guiding and cladding layers have a same As/P ratio.

5. An optical semiconductor device, according to claim 1, wherein:

said well layer has the same In/Ga ratio as said barrier layer; and said well layer is compressively strained.

6. An optical semiconductor device, according to claim 5, further comprising an intermediate layer between said well layer and said barrier layer, wherein:

said intermediate, well and barrier layers have a same In/Ga ratio and As/P ratio; and said intermediate layer has a Al ratio in III group element contained therein which is a medium value between said barrier layer and said well layer.

7. An optical semiconductor device, according to claim 6, further comprising guiding layers sandwiching said multiquantum well structure and cladding layers sandwiching said guiding layers, wherein:

said well, barrier and guiding layers or said well, barrier, guiding and cladding layers have a same As/P ratio.

8. An optical semiconductor device, according to claim 5, further comprising guiding layers sandwiching said multiquantum well structure and cladding layers sandwiching said guiding layers, wherein:

said well, barrier and guiding layers or said well, barrier, guiding and cladding layers have a same As/P ratio.

9. An optical semiconductor device which includes a multiquantum well structure comprising a compressive strained well layer and a barrier layer, according to claim 1, wherein:

an amount of strain in said well layer is increased, a thickness of said well layer is decreased or a bandgap in said barrier layer is reduced such that a light hole level does not exist in a potential well of said well layer.

10. An optical semiconductor device which includes a multiquantum well structure comprising a well layer and a barrier layer, wherein:

said well layer is made of InGaAs;

said barrier layer is made of InGaAlAs;

said well layer has the same In/Ga ratio as said barrier layer; and said well layer is compressively strained.

11. An optical semiconductor device, according to claim 10, further comprising an intermediate layer between said well layer and said barrier layer, wherein:

said intermediate, well and barrier layers have a same In/Ga ratio and As/P ratio; and said intermediate layer has a Al ratio in III group element included therein which is a medium value between said barrier layer and said well layer.

12. An optical semiconductor device which includes a multiquantum well structure comprising a well layer and a barrier layer, wherein:

said well layer is made of InGaP;

said barrier layer is made of InGaAlP;

said well layer has the same In/Ga ratio as said barrier layer; and said well layer is compressively strained.

13. An optical semiconductor device, according to claim 12, further comprising an intermediate layer between said well layer and said barrier layer, wherein:

said intermediate, well and barrier layers have a same In/Ga ratio and As/P ratio; and said intermediate layer has a Al ratio in III group element included therein which is a medium value between said barrier layer and said well layer.

14. An optical semiconductor device which includes a multiquantum well structure comprising a compressive strained InAsP well layer and a InGaAsP barrier layer, wherein:

said well layer has the same As/P ratio as said barrier layer; said well and barrier layers and an InGaAsP intermediate layer have a constant As/P ratio when said InGaAsP intermediate layer is provided between said well and barrier layers; and said intermediate layer has a Ga ratio in III group element contained therein which is less than that of said barrier layer.

* * * * *